United States Patent
Visconti et al.

(10) Patent No.: US 12,307,128 B2
(45) Date of Patent: May 20, 2025

(54) MEMORY ACTIVATION TIMING MANAGEMENT

(71) Applicant: Micron Technology, Inc., Boise, ID (US)

(72) Inventors: Angelo Visconti, Appiano Gentile (IT); Daniele Balluchi, Cernusco sul Naviglio (IT); Giorgio Servalli, Fara Gera d'Adda (IT)

(73) Assignee: Micron Technology, Inc., Boise, ID (US)

( * ) Notice: Subject to any disclaimer, the term of this patent is extended or adjusted under 35 U.S.C. 154(b) by 61 days.

(21) Appl. No.: 17/550,297

(22) Filed: Dec. 14, 2021

(65) Prior Publication Data

US 2022/0197564 A1    Jun. 23, 2022

Related U.S. Application Data

(60) Provisional application No. 63/126,883, filed on Dec. 17, 2020.

(51) Int. Cl.
*G06F 3/06* (2006.01)
*G11C 11/22* (2006.01)
(Continued)

(52) U.S. Cl.
CPC .......... *G06F 3/0659* (2013.01); *G06F 3/0619* (2013.01); *G06F 3/0673* (2013.01);
(Continued)

(58) Field of Classification Search
CPC .... G06F 3/0659; G06F 3/0619; G06F 3/0673; G06F 3/0679; G11C 11/223;
(Continued)

(56) References Cited

U.S. PATENT DOCUMENTS 8,560,796 B2   10/2013   Xu et al.
8,572,322 B2   10/2013   Xu et al.
(Continued)

OTHER PUBLICATIONS

NPL Zangeneh et al. "Design and Optimization of Nonvolatile Multibit 1T1R Resistive RAM", IEEE Transactions of Very Large Scale Integration (VLSI) Systems, vol. 22, No. 8, Aug. 2014. (Year: 2014).*

(Continued)

*Primary Examiner* — Hosain T Alam
*Assistant Examiner* — Zubair Ahmed
(74) *Attorney, Agent, or Firm* — Brooks, Cameron & Huebsch, PLLC

(57) ABSTRACT

Systems, apparatuses, and methods related to memory activation timing management are described herein. In an examples, memory activation timing management can include receiving a first command associated with a set of memory cells, activating the set of memory cells to perform a memory access responsive to the first command, precharging the set of memory cells associated with the first command, receiving a second command associated with the set of memory cells, determining that the set of memory cells associated with the first command is a recently activated set of the plurality of sets of memory cells, imparting a delay, and applying a sensing voltage to the set of memory cells associated with the second command to perform a memory access responsive to the second command.

20 Claims, 5 Drawing Sheets

(51) Int. Cl.
*G11C 11/4076* (2006.01)
*G11C 13/00* (2006.01)

(52) U.S. Cl.
CPC ......... *G11C 11/223* (2013.01); *G11C 11/2293* (2013.01); *G11C 11/4076* (2013.01); *G11C 13/0061* (2013.01)

(58) Field of Classification Search
CPC ............ G11C 11/2293; G11C 11/4076; G11C 13/0061; G11C 7/12; G11C 7/22; G11C 11/4094; G11C 11/2273; G11C 11/2275; G11C 13/0035; G11C 13/004; G11C 13/0069
USPC .................................................. 711/104, 101
See application file for complete search history.

(56) References Cited

U.S. PATENT DOCUMENTS

| | | | | |
|---|---|---|---|---|
| 2008/0203443 | A1* | 8/2008 | Wilson | H01L 27/1203 257/295 |
| 2009/0201752 | A1* | 8/2009 | Riho | G11C 8/10 365/225.7 |
| 2009/0245245 | A1* | 10/2009 | Malwankar | G06F 13/4059 375/240 |
| 2012/0127776 | A1* | 5/2012 | Kawashima | G11C 7/065 365/145 |
| 2014/0089574 | A1 | 3/2014 | Sohn | |
| 2014/0195764 | A1* | 7/2014 | Shen | G06F 13/1689 365/230.02 |
| 2015/0098284 | A1 | 4/2015 | Lee | |
| 2015/0109871 | A1* | 4/2015 | Bains | G11C 11/40611 365/222 |
| 2016/0124873 | A1 | 5/2016 | Xu | |
| 2017/0301390 | A1 | 10/2017 | Fujishiro | |
| 2018/0276150 | A1* | 9/2018 | Eckert | G06F 13/1642 |
| 2019/0333562 | A1* | 10/2019 | Vo | G11C 11/221 |
| 2020/0335163 | A1 | 10/2020 | Jung | |

OTHER PUBLICATIONS

International Search Report and Written Opinion from related International Patent Application No. PCT/US2021/061977, dated Mar. 22, 2022, 9 pages.

* cited by examiner

MEMORY ACTIVATION TIMING MANAGEMENT

PRIORITY INFORMATION

This Application claims benefit to Provisional Application Ser. No. 63/126,883, filed on Dec. 17, 2020, the contents of which are incorporated herein by reference.

TECHNICAL FIELD

The present disclosure relates generally to apparatuses, systems, and methods for memory activation timing management.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices can be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
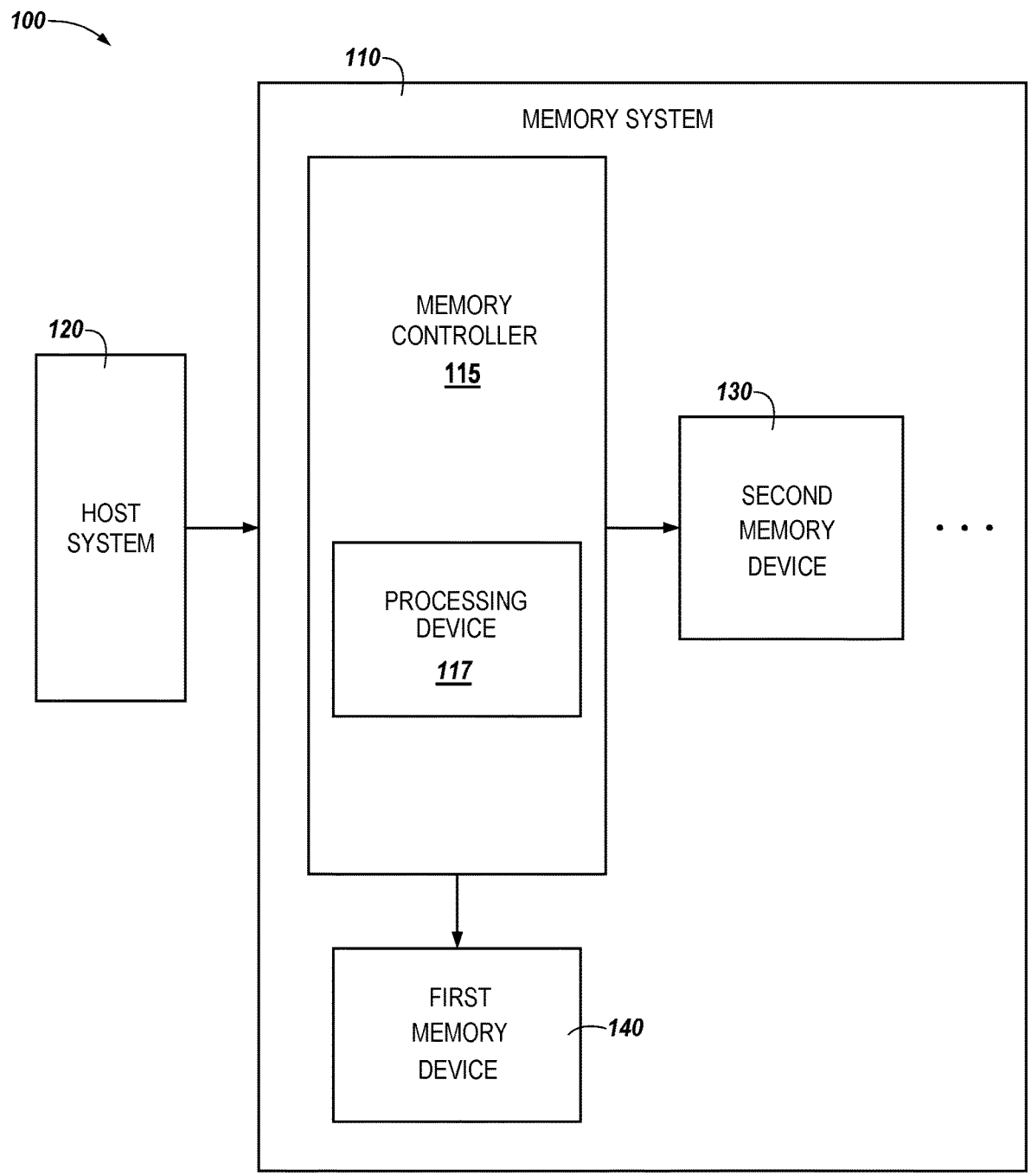
FIG. 1 illustrates an example computing system that includes a memory system in accordance with a number of embodiments of the present disclosure.

Systems, apparatuses, and methods related to memory activation timing management are described herein. Memory cells of a memory device can be programmed to a target (e.g., desired) data state. For instance, an electric charge can be placed on or removed from a charge storage structure (e.g., a floating gate or a replacement gate) of a memory cell in a page to program the memory cell to a particular data state (e.g., store data).

However, data stored in a memory cell can become unreliable (e.g., lost) due to various factors. For example, charge leakage from memory cells can result in a loss of data. Memory cells (e.g., volatile memory cells) can be periodically refreshed (e.g., via a block refresh) at a particular rate. Although, periodically refreshing memory cells can be sufficient (e.g., frequent enough) to maintain data integrity, in many instances memory cell charges can change due to various factors and/or a memory cell can wear-out over time.

For instance, the repeated activation of memory cells (e.g., of a particular row) corresponding to at least a portion page can be referred to as "page hammering." Such continuous repeated memory accesses (e.g., via repeated pre-charge and subsequent activation cycles) can occur within a short duration. Therefore, due to an absence of sufficient amount of "wait" time between a completion of a pre-charge pulse and initiation of a subsequent activation pulse the memory cells of a row can be forced to wait in the same logic state. Such "continuous" repeated accessing of memory cells of rows can occur with open pages (e.g., as a "continuous open page" wear-out mechanism (COP)) or for closed page (e.g., as a "continuous closed page" wear-out mechanism (CCP)). As used herein, "logic state" refers to a value that corresponds to whether the capacitor of a cell is charged or discharged.

As used herein, an open page refers to a page which is operated in accordance with an open-page policy which allows a memory controller to leave a page of memory open for a certain amount of time after a read operation or a write operation. As used herein, a closed page refers to a page which is operated in accordance with a closed-page policy that ensures that a page of memory is closed immediately after a read operation or a write operation. In any case, the COP and CCP wear out mechanisms can lead to charge leakage and/or memory cell wear-out, and therefore can cause data corruption and/or cause memory cells to prematurely wear-out.

Moreover, repeated accessing of the memory cells of a particular row in a particular state (e.g., a particular logic state) can exacerbate the impact of the repeated accesses of the memory cells. For instance, repeatedly accessing memory cells while in a given state (e.g., in the same state for each access) can result in an unexpected and/or premature closure of a read window, and thus a failure of any subsequent attempt to read the data in the memory cells. It has been discovered that such read window closures/resultant failure of any subsequent attempts can be encountered sooner than would otherwise be expected based solely on other wear-out mechanisms such as "fast cycling" or multiple repeated read/writes to the memory cells of the particular row. Thus, it can be beneficial to prevent COP and CCP wear-out mechanisms from occurring.

As such, memory activation timing management, as described herein, can prevent or mitigate COP and CCP wear-out mechanisms. For instance, memory activation timing management can include receiving a first command associated with a set of memory cells in a memory device, activating the set of memory cells for a first time period to perform a memory access responsive to the first command, pre-charging, for a second time period, the set of memory cells associated with the second command after a fourth time period, receiving a second command associated with a set of memory cells, determining that the set of memory cells is a recently activated set of memory cells, as detailed herein, imparting a delay for a third time period, and applying a sensing voltage to the set of memory cells associated with the second command to perform a memory access responsive to the second command. In some embodiments, the fourth time period can be the time that elapses after the initial activation (e.g., first time period) but before the pre-charge (e.g., second time period).

Notably, such memory activation timing management can prevent COP and CCP wear-out mechanisms by imparting the delay for the third time period, when the set of memory cells is a previously activated set of memory cells. For instance as detailed herein, the third time period can have length to ensure a sufficient "wait" time between activation of memory cells and/or a state change be changed from a first state to a second state to avoid "waiting" in the same state. Yet, memory activation timing management as detailed herein, notably can refrain from imparting a delay to avoid any negative impact on performance when the set of memory cells is not be a recently activated set of memory cells.

As used herein, a "set of memory cells" or "set" refers to a physical arrangement of memory cells such as a row of memory cells or a portion of a row of memory cells, among other possible configurations of memory cells. As used herein, a "row of memory cells" or "row" refers to an arrangement of memory cells that can be activated together (e.g., via access lines). Each row can include a number of pages. As used herein, the term "page" and "pages of memory cells" can be interchangeably used. As used herein, a "page" refers to a unit of programming and/or sensing (e.g., a number of memory cells that are programmed and/or sensed together as a functional group). In some embodiments each row (or a subset of a row) can comprises one page of memory cells.

In some embodiments, a determination can be made whether a fourth time period is less than an active time threshold. In such embodiments, a delay can be imparted when the fourth time period is less than an active time threshold. For instance, activation times for open pages and closed pages can differ. Accordingly, in such embodiments the delay can be imparted to prevent COP wear-out mechanisms (e.g., by imparting the delay responsive to a determination that a fourth time period is less than an active time threshold) and/or to avoid imparting the delay responsive to a longer fourth time period on a closed page.

Additionally, when a threshold number of different sets of memory cells (e.g., a total of three different rows) are activated between a first activation and a subsequent activation to a particular set of memory cells, then embodiments herein can refrain from imparting the delay and thus avoid incurring any negative impact on performance associated with imparting the delay. Without wishing to be bound by theory, it is believed that when a threshold number of rows are activated between a first activation to a particular set of memory cells and a subsequent activation to the set of memory cells, then a sufficient amount of time between the first activation and the subsequent activation may have elapsed to inherently avoid occurrence of COP and CCP wear-out mechanisms.

In some embodiments, the memory system can be a Compute Express Link (CXL) compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface. In some embodiments, the CXL technology can include a plurality of I/O lanes configured to transfer the plurality of commands to or from circuitry external to the memory controller at a rate of around thirty-two (32) giga-transfers per second. In another embodiments, the CXL technology can comprise a peripheral component interconnect express (PCIe) 5.0 interface coupled to a plurality of I/O lanes, wherein the memory controller is to receive commands involving at least one of a memory device, a second memory device, or any combination thereof, via the PCIe 5.0 interface according to a compute express link memory system.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

As used herein, designators such as "P," etc., for example, particularly with respect to reference numerals in the drawings, indicate that a number of the particular feature can be included. It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of" "at least one," and "one or more" (e.g., a number of sound devices) can refer to one or more sound devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context.

The figures herein follow a numbering convention in which the first digit or digits correspond to the figure number and the remaining digits identify an element or component in the figure. Similar elements or components between different figures can be identified by the use of similar digits. For example, 110 can reference element "10" in FIG. 1, and a similar element can be referenced as 310 in FIG. 3. A group or plurality of similar elements or components can generally be referred to herein with a single element number. For example, a plurality of reference elements 327-1, . . . , 327-P (e.g., 327-1 to 327-P) can be referred to generally as 327. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 illustrates an example computing system 100 that includes a memory system 110 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In some embodiments, the computing system 100 can include a memory system 110 including a memory controller 115 and memory devices 130, 140. The computing system 100 can be coupled to a host system 120.

In some embodiments, the memory controller 115 can be configured to manage a DRAM memory device. The memory devices 130, 140 can provide main memory for the computing system 100 or could be used as additional memory or storage throughout the computing system 100. In some embodiments, the memory devices 130, 140 can be a ferroelectric field-effect transistor (FeFET) memory device. In another embodiment, the memory devices 130, 140 can be a dynamic random-access memory (DRAM), ferroelectric random-access memory (FeRAM), or a resistive random-access memory (ReRAM) device, or any combination thereof. The memory devices 130, 140 can include one or more arrays of memory cells, e.g., volatile and/or non-volatile memory cells. In various embodiments, the memory devices 130, 140 can include at least one array of volatile memory cells. Embodiments are not limited to a particular type of memory device. For instance, the memory devices can include RAM, ROM, DRAM, SDRAM, PCRAM, RRAM, and flash memory, among others. Although shown as two memory devices 130, 140, it will be appreciated that a single memory device or three or more memory devices, are contemplated within the scope of the disclosure.

A memory system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory systems 110. In some embodiments, the host system 120 is coupled to different types of memory system 110. As used herein, "coupled to" or "coupled with" generally refers to a connection between components, which can be an indirect communicative connection (e.g., with intervening components) or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory system 110, for example, to perform a command. As used herein, the term "command" refers to an instruction from a memory system to perform a task or function. For example, the memory controller 115 of the memory system 110 can cause a processing device 117 to perform a task based on a given command. In some embodiment, a command can include a memory request. That is, a command can be a request to the read and/or write data from and/or to the memory device (e.g., second memory device 130 and/or first memory device 140). The host system 120 may, for example, write data to the memory system 110 and read data from the memory system 110 based on a command (e.g., memory request).

The host system 120 can be coupled to the memory system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory system 110. The host system 120 can further utilize an NVM Express (NVMe) interface to access components (e.g., memory devices 130, 140) when the memory system 110 is coupled with the host system 120 by the PCIe interface. The physical host interface can provide an interface for passing control, address, data, and other signals between the memory system 110 and the host system 120. In general, the host system 120 can access multiple memory systems via a same communication connection, multiple separate communication connections, and/or a combination of communication connections.

The memory devices 130, 140 can include any combination of the different types of non-volatile memory devices and/or volatile memory devices. Examples of volatile memory devices can be, but are not limited to, random access memory (RAM), such as dynamic random-access memory (DRAM) and synchronous dynamic random-access memory (SDRAM).

Some examples of non-volatile memory devices can include, but are not limited to, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

Each of the memory devices 130, 140 can include one or more arrays of memory cells. One type of memory cell, for example, single level cells (SLC) can store one bit per cell.

Other types of memory cells, such as multi-level cells (MLCs), triple level cells (TLCs), quad-level cells (QLCs), and penta-level cells (PLC) can store multiple bits per cell. In some embodiments, each of the memory devices 130, 140 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130, 140 can be grouped as pages that can refer to a logical unit of the memory device used to store data. In some embodiments, pages of memory cells can be comprised of one or more rows of memory cells. In addition, a row of memory cells can be comprised of one or more sets of memory cells.

The memory controller 115 (or controller 115 for simplicity) can communicate with the memory devices 130, 140 to perform operations such as reading data, writing data, or erasing data at the memory devices 130, 140 and other such operations. The memory controller 115 can include hardware such as one or more integrated circuits and/or discrete components, a buffer memory, or a combination thereof. The hardware can include digital circuitry with dedicated (i.e., hard-coded) logic to perform the operations described herein. The memory controller 115 can be a microcontroller, special purpose logic circuitry (e.g., a field programmable gate array (FPGA), an application specific integrated circuit (ASIC), etc.), or other suitable processor.

While the example memory system 110 has been illustrated in FIG. 1 as including the memory controller 115, in another embodiment of the present disclosure, a memory system 110 does not include a memory controller 115, and can instead rely upon external control (e.g., provided by an external host, or by a processor or controller separate from the memory system).

In general, the memory controller 115 can receive commands or operations from the host system 120 and can convert the commands or operations into instructions or appropriate commands to achieve the desired access to the memory device 130 and/or the memory device 140. The memory controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130, 140. The memory controller 115 can further include host interface circuitry to communicate with the host system 120 via the physical host interface. The host interface circuitry can convert the commands received from the host system into command instructions to access the second memory device 130 and/or the first memory device 140 as well as convert responses associated with the second memory device 130 and/or the first memory device 140 into information for the host system 120.

The memory system 110 can also include additional circuitry or components that are not illustrated. In some embodiments, the memory system 110 can include a cache or buffer (e.g., DRAM) and address circuitry (e.g., a row decoder and a column decoder) that can receive an address from the memory controller 115 and decode the address to access the second memory device 130 and/or the first memory device 140.

As discussed herein, the memory system 110 can experience charge leakage and/or parasitic currents due to repeated access of a set of memory cells. In some instances, charge leakage and/or parasitic currents can cause data corruption in a page associated with the set of memory cells and/or cause the page associated with the set of memory cells to wear-out. In some embodiments, the memory controller 115 can mitigate and/or prevent charge leakage and/or parasitic currents using memory activation timing management, as detailed herein, to eliminate data corruption in the page and/or eliminate wear-out of the page.

For example, in some embodiments, the memory controller 115 can receive a first command associated with a set of memory cells in a memory device (e.g., second memory device 130 and/or first memory device 140) including a plurality of sets of memory cells corresponding to respective portions of an array of memory cells of the memory device (e.g., second memory device 130 and/or first memory device 140). The command can be associated with a request to read data (e.g., read request) from the memory system 110 or a request to write data (e.g., write request) to the memory system 110. The memory controller 115 can activate the set of memory cells for a first time period to perform a memory access of the memory device (e.g., second memory device 130 and/or first memory device 140) responsive to the command. For example, the memory controller 115 can cause the set of memory cells to activate to write data to a memory device (e.g., second memory device 130 and/or first memory device 140). Similarly, the memory controller 115 can cause the set of memory cells to activate to read data stored on a memory device (e.g., second memory device 130 and/or first memory device 140). As used herein, the term "activate" refers to the act of opening a row, set, and/or page to permit a read and/or write of data to the row, set, and/or the page once opened. For example, one or more row access commands can be asserted on a row, set, and/or page of memory cells to cause data (e.g., charges) stored by the memory cells to be read by circuitry associated with the memory device.

The memory controller 115 can receive a second command associated with a set of memory cells. The second and/or subsequent command can cause activation of the same set of memory cells (e.g., the same set of memory cells as those associated with a first command) to perform a memory access responsive to the second command and/or the subsequent command. In some embodiments, repeated activation of a set of memory cells in the same logic state can cause data corruption in the page associated with the set of memory cells and/or wearing-out of the page associated with the set of memory cells. Said differently, repeated activation of a set of memory cells (e.g., repeated activation within a short amount of time) can cause COP/CCP hammering and related issues such as data corruption, etc. To prevent COP and/or CCP, the memory controller 115 can impart a delay prior to activating the set of memory cells to perform a memory access responsive to the second command and/or a subsequent command.

For instance, prior to performing a memory access responsive to the second command (i.e., a second memory access), the memory controller 115 can pre-charge a set of memory cells. In some embodiments, the memory controller 115 can pre-charge the set of memory cells to deactivate the set of memory cells after the memory access has been performed responsive to the first command. As used herein, the term "pre-charge" refers to the act of applying a voltage to bit lines (e.g., digit lines) coupled to the memory cells to close an open set, row, and/or page to put the set, row, and/or page in an idle state.

Before the memory controller 115 activates the set of memory cells to perform a second memory access responsive to the second command, the memory controller 115 can determine that the set of memory cells is a recently activated set of memory cells. In some embodiments, the memory controller 115 can determine if the set of memory cells has been activated within an active time threshold to determine if the set of memory cells has been recently activated. Alternatively or in addition, in some embodiments the memory controller 115 can determine whether the set of memory cells is a recently activated set of memory cells by looking at a data store and/or data table which tracks a history of recently activated sets of memory cells (e.g., addresses, pages, and/or times of prior accesses), among other possible information associated with sets of memory cells.

Responsive to a determination that the set of memory cells is a recently activated set of memory cells, the memory controller 115 can impart a delay (e.g., during and/or after the pre-charge of the of the set of memory cells) and/or can alter from the first logic state to a second logic state prior to and/or during imparting the delay. For instance, in some embodiments, responsive to a determination that the set of memory cells is a recently activated set of memory cells, the memory controller 115 can impart a delay and alter from the first logic state to a second logic state while imparting the delay. Such imparting of the delay and altering the logic state, prior to activation of the set of memory cells (e.g., memory cells associated with a second command), can avoid or mitigate CCP and COP and thus avoid or mitigate any potential impact (e.g., charge loss, data corruption, memory cell wear-out, etc.) of the CCP and COP.

The processing device 117 can impart the delay, for a third time period. In some embodiments, the third time period can be from about 400 nanoseconds (ns) to about 1000 ns or from about 400 ns to about 600 ns. All individual values and subranges from 400 ns to 1000 ns and from about 400 ns to about 600 ns are included; for example, the third time period can have a lower limit of 400 ns, 415 ns, 425 ns, 440 ns, 450 ns, 465 ns, 485 ns, 500 ns or 600 ns to an upper limit of 1000 ns, 900 ns, 800 ns, 700 ns, or 600 ns.

The memory controller 115 can activate the set of memory cells to perform a second memory access responsive to the second command after the delay. In some embodiments, the memory controller 115 can perform the second memory access by applying a sensing voltage to the memory cells of the set of memory cells. For instance, the memory controller 115 can activate the set of memory cells to read data from the memory system 110 (e.g., read request) or a request to write data to the memory system 110 (e.g., write request) by applying a sensing voltage to the set of memory cells.

In some embodiments, the memory controller 115 can include a processing device 117 configured to execute instructions to perform the operations described herein. For example, the memory controller 115 can cause the processing device 117 to activate the set of memory cells for a first time period to perform a first memory access responsive to a first command. In addition, the memory controller 115 can cause the processing device 117 to pre-charge for a second time period, a set of memory cells and determine that the set of memory cells is a recently activated set of memory cells of the plurality of sets of memory cells.

Figure 2:
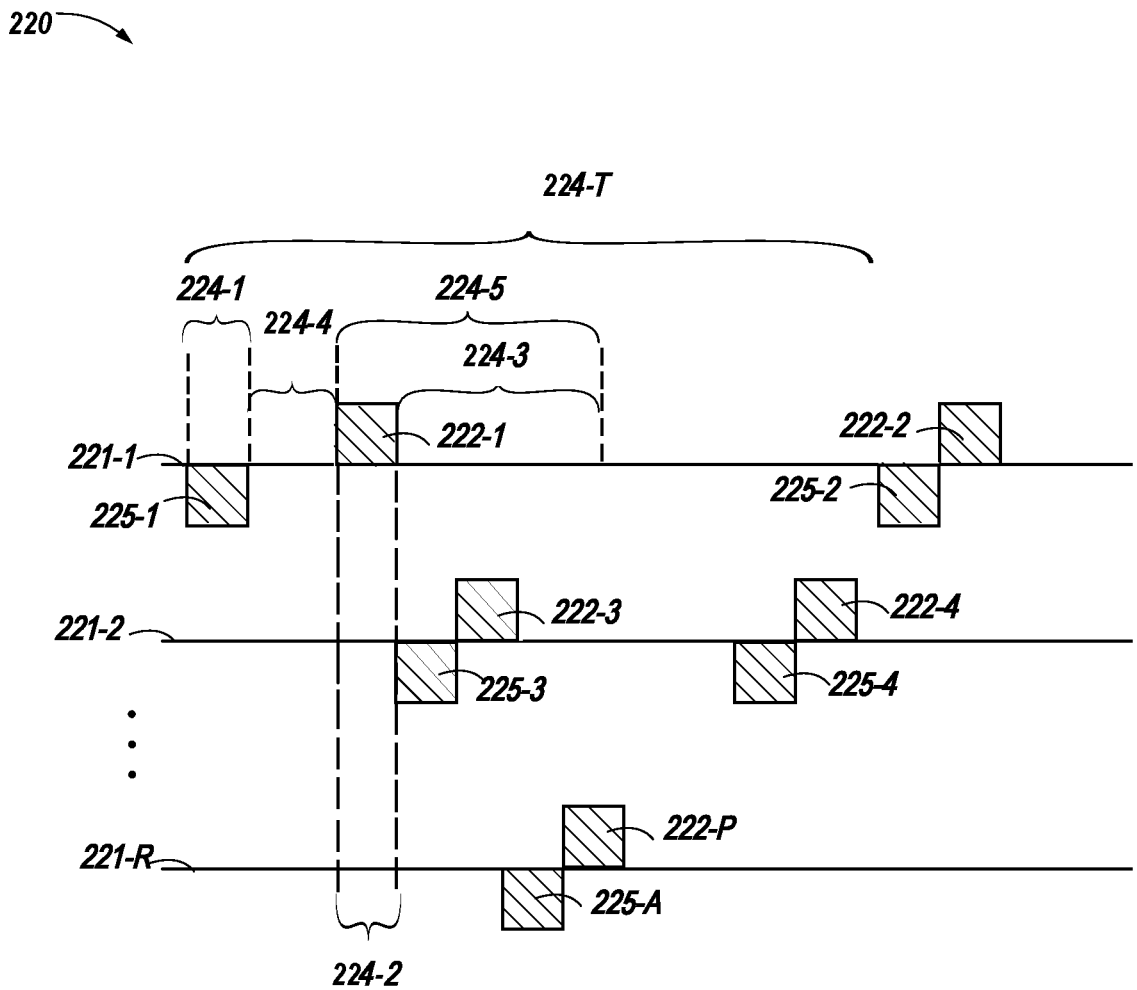
FIG. 2 illustrates an example functional diagram that includes memory cells arranged in rows in accordance with a number of embodiments of the present disclosure.

FIG. 2 illustrates an example functional diagram 220 that includes memory cells arranged in rows such as rows 221-1, 221-2, . . . 221-P (hereinafter collectively referred to as rows 221) in accordance with a number of embodiments of the present disclosure. The functional diagram 220 can be used in connection with the computer system (e.g., computer system 100 of FIG. 1).

In some embodiments, a memory controller such as those described herein can receive a first command and initiate a first activation 225-1 on a first row 221-1 for a first time period 224-1 in a first logic state. The first activation 225-1 can initiate a memory access of one or more memory devices. In some embodiments, the first time period 224-1 can be from 95 ns to about 500 ns. All individual values and subranges from 95 ns to 500 ns are included; for example, the first time period can have a lower limit of 115 ns, 150 ns, 175 ns, 200 ns, 250 ns, 275 ns, 300 ns, 325 ns, or 350 ns to an upper limit of 300 ns, 325 ns, 350 ns, 375 ns, 400 ns, 425, ns 450 ns, or 475 ns. In addition, the memory controller can receive a second command after the first command.

In some embodiments, repeated activations 225 on the same set of memory cells such as the first row 221-1 can cause a COP or CCP wear-out mechanism. To prevent the issues caused by a COP or CCP wear-out mechanism the memory controller can alter the logic state of memory cells of a row such as the memory cells of the first row 221-1 and impart a delay before a subsequent activation of the first row 221-1. As used herein, activation of a row can include activation or all the row or a activation of subset of the row. For instance, activation of a row can include activating all transistors in a row or can include activating some but not all transistors on a row. Activation of a row (or similarly activation of a subset of a row) can permit information to be stored on or accessed from the row.

For example, the memory controller can alter the logic state (e.g., switch the logic state from a "1" to a "0") after the first activation 225-1 and fourth time period 224-4 on the first row 221-1. Thus the memory controller can impart a delay, as detailed herein, and/or initiate a pre-charge 222-1 on a first row 221-1 for a second time period 224-2 (e.g., tRP) while in the altered logic state (e.g., second logic state). In some embodiments, the fourth time period 224-4 can be the time that elapse after the first activation 225-1 (e.g., first time period 224-1) but before the pre-charge 222-1 (e.g., before the second time period 224-2). However, as used herein logic states are not limited to "1" or "0" and can include other values/types of logic states. If the memory controller determines that the row 221-1 is a recently activated row, the memory controller can impart a delay after the pre-charge 222-1 for a third time period 224-3. In some embodiments, the memory controller can determine that the first row 221-1 is a recently activated row if the first row 221-1 is subsequently activated within a threshold amount of time. As mentioned, the third time period (i.e., delay) can be from about 400 nanoseconds (ns) to about 1000 ns. In some embodiments, the third time period 224- is equal to or greater than the fourth time period 224-4. For instance, the length of the delay (e.g., third time period 224-3) can be greater than the length of the first activation (e.g., first time period 224-1) on the first row 221-1. In another embodiment, the length of the delay (e.g., third time period 224-3) can be the equal to the length of the first activation (e.g., first time period 224-1) on the first row 221-1.

The delay for the third time period 224-3 can create a break in the systematic and semi-continuous wait in the first logic state on the first row 221-1. The created break can prevent and or minimize COP and CCP wear-out mechanism. Thus, the set of memory cells such as the first row of memory cells 221-1 can be subsequently activated without causing data corruption in the row or other potential issues associated with COP and CCP wear-out mechanisms.

In some embodiments, the memory controller can initiate a second activation 225-2 after the delay to perform a memory access associated with a second command. The memory controller can apply a sensing voltage to a row of memory cells after pre-charging the row 221-1 of memory cells for the second time period 224-2 and imparting the delay on the row 221-1 of memory cells for the third time period 224-3 to initiate the second activation 225-2. In some embodiments, the second activation 225-2 can occur after a fifth time period 224-5 (e.g., tRPSP). The fifth time period 224-5 can be a combination of the second time period 224-2 (e.g., a per-charge time) and the third time period 224-3 (e.g., a delay time). In addition, the memory controller can initiate a second pre-charge 222-2 after the second activation 225-2. In some embodiments, the second pre-charge 222-2 can close the open first row 221-1 after the second activation 225-2.

A sixth time period 224-T can be equal to a time (tRCSP) between activations on the same set of memory cells (e.g., same row of memory cells) such as a time between initiation of the first activation 225-1 (e.g., a memory access) and initiation of the second activation 225-2. In some embodiments, imparting the delay for the third time period 224-3 can ensure that the sixth time period 224-T is greater than or equal to a sum of at least two times the first time period 224-1 and the second time period 224-2. Thus, in some embodiments the delay for the third time period 224-3 can be imparted for a duration sufficient to ensure that the sixth time period 224-T is greater than or equal to the sum of at least two*(the first time period 224-1)+(the second time period 224-2). For instance, the sixth time period 224-T can be equal to 2.0*(the first time period 224-1)+(the second time period 224-2), or equal to 2.5*(the first time period 224-1)+(the second time period 224-2), in some embodiments. Having the sixth time period 224-T be greater than or equal to the sum of at least two*(the first time period 224-1)+(the second time period 224-2) and/or equal to two*[(the first time period 224-1)+(the second time period 224-2)] can ensure sufficient "wait" time between activations on the same set and thereby prevent or mitigate COP and CCP.

For instance, in some embodiments, the delay for the third time period 224-3 can be imparted for a time sufficient to ensure that the sixth time period 224-T can be a value that is greater than a value in a range from about 470 ns to 2000 ns. All individual values and subranges from 470 ns to 2000 ns are included. For instance, in some embodiments, the sixth time period 224-T can be equal to or greater than 1070 ns, greater than 1100 ns, greater than 1140 ns, greater than 1200 ns, greater than 1300 ns, greater than 1500 ns, greater than 1700 ns, and/or greater than 2000 ns, among other possible values. In some embodiments, the sixth time period 224-T can be in a range from 1000 ns to 2000 ns, from 1070 ns to 2000 ns, from 1140 ns to 2000 ns, from 1070 ns to 1500 ns, from 1070 ns to 1400 ns, from 1070 to 1200 ns, or from 1140 to 1200 ns.

In some embodiments, the memory controller can impart a delay for an activation on a first row 221-1 corresponding to at least a portion of a first page of memory cells and a pre-charge 222-1 on the first row 221-1, yet, will refrain from imparting (i.e., not impart) a delay before subsequent activations (e.g., 225-4, 225-5, and/or 225-B) on different sets of memory cells such as a second row 221-2 and/or a subsequent row 221-P). For example, memory controller may not impart a delay after an initial activation 225-3 (e.g., third activation) and initial pre-charge 222-3 (e.g., third pre-charge) on the second row 221-2. Likewise, the memory controller can refrain from imparting a delay after a second activation 225-4 (e.g., fourth activation) and second pre-charge 222-4 (e.g., fourth pre-charge) on the second row 221-2. In addition, the memory controller can refrain from imparting a delay after an initial activation 225-A (e.g., fifth activation) and initial pre-charge 222-P (e.g., fifth pre-charge) on the third row 221-R. That is, the memory controller may not impart a delay on subsequent rows (e.g., 221-2 and/or 221-R) if an active time threshold has been met on the subsequent rows Similarly, in some examples, the memory controller will refrain from imparting a delay after an initial activation 225-1 and a subsequent pre-charge 222-1 when a sufficient amount of time and/or threshold number of activations has occurred on different sets of memory cells (e.g., different sets of memory cells than the first row of memory cells 221-1).

Figure 3:
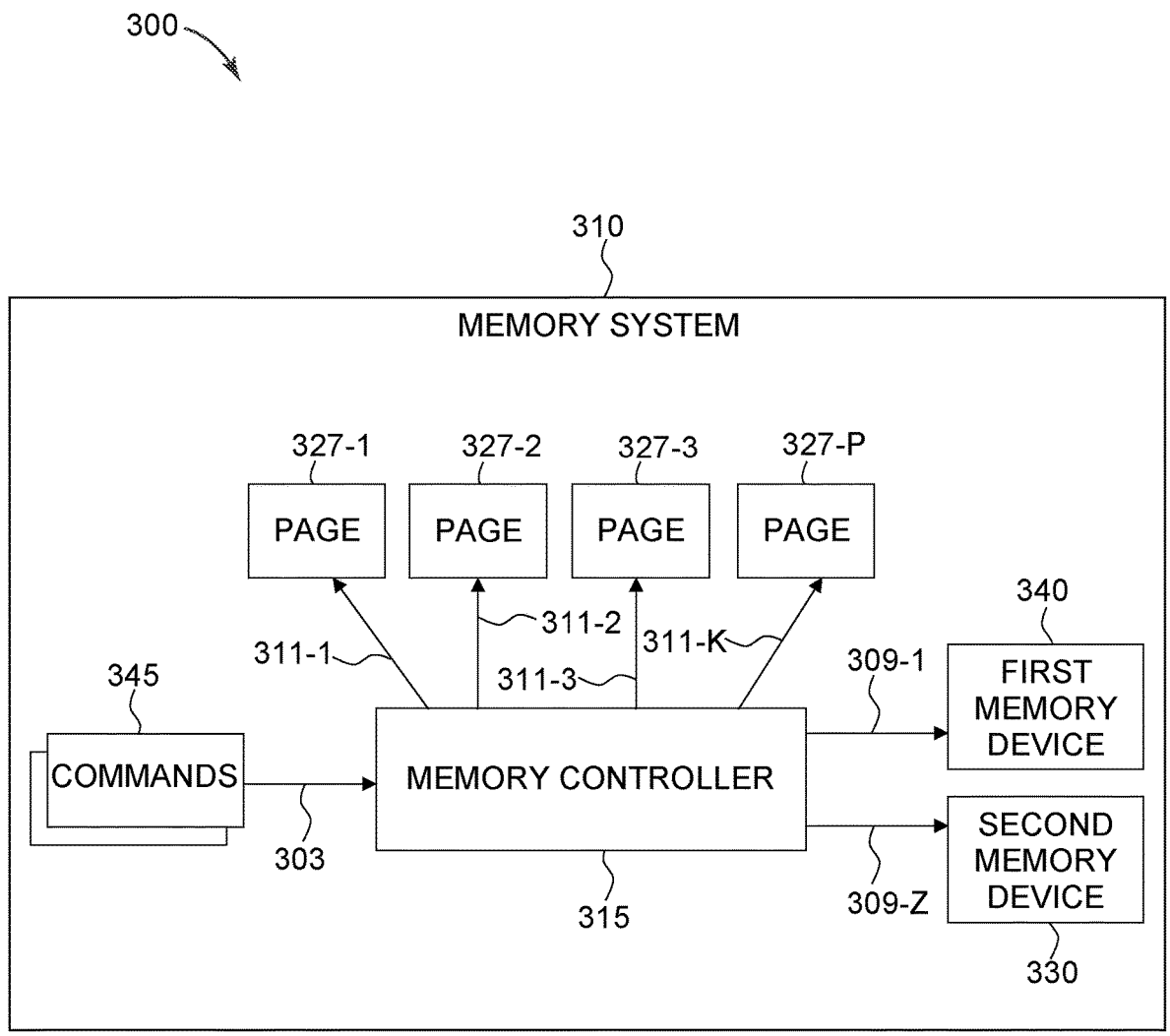
FIG. 3 is functional block diagram in the form of a computing system including a memory system having memory controller and memory devices in accordance with a number of embodiments of the present disclosure.

FIG. 3 is functional block diagram in the form of a computing system 300 including a memory system 310 having memory controller 315 and memory devices 330, 340 in accordance with a number of embodiments of the present disclosure. The computer system 300, memory system 310, memory controller 315, and the memory devices 330, 340 can be analogous to the computer system 100, memory system 110, memory controller 115, and the memory devices 130, 140 illustrated in FIG. 1, herein. Although shown as two memory devices 330, 340, it will be appreciated that a single memory device or three or more memory devices, are contemplated within the scope of the disclosure.

A plurality of commands 345 can be received by the memory system 310. The commands 345 can be a read request (e.g., a request to retrieve data stored by the memory devices 330, 340) or a write request (e.g., a request to write data to the memory devices 330, 340). In some embodiments, the commands 345 can be received from circuitry external to the memory system 310, such as from a host system or host (e.g., the host system 120 illustrated in FIG. 1, herein). The commands 345 can be received via an interface 303.

In some embodiments, the interface 303 can be configured such that signaling can be selectively transferred via the interface 303. For example, signaling can be selectively transferred via the interface 303 in which data is transferred between a host and the memory system 310 or signaling can be selectively transferred via the interface 303 in which data is transferred between a host and the memory devices 330, 340.

In some embodiments, the commands 345 can be received by the memory controller 315 via the interface 303. For example, the memory controller 315 can be configured to, receive a plurality of commands 345 associated to a plurality of sets of memory cells such as a plurality of row. The rows can correspond to at least a portion of a plurality of pages 327-1, 327-2, 327-3, and 327-P (herein referred collectively as pages 327) in a memory device (e.g., memory device 330 and/or memory device 340). The controller 315 can activate a first row corresponding to at least a portion of the first page 327-1 of the plurality of pages 327, via interface 311-1, for a first time period, in a first logic state, to perform a first memory access responsive to a first command of the plurality of command 345. Similarly, the memory controller 315 can activate additional rows corresponding to at least a portion of the second page 327-2, the third page 327-3, and/or the fourth page 327-P, via interface 311-2, 311-3, 311-K, respectively.

The memory controller 315 can access a memory device (e.g., first memory device 340 and/or second memory device 330), via interface 309-1 and/or 309-Z, to activate a row of memory cells corresponding to at least a portion of the first page 327-1 of the memory system 310 and perform the first memory access responsive to the first command.

In some embodiments, the memory controller 315 can receive a second command of a plurality of commands 345. As such, the memory controller 315 can determine that the set of memory cells (e.g., the first row of memory cells associated with the first page 327-1 of memory cells) is a recently activated set of memory cells before activating the set of memory cells to perform a second memory access responsive to a second command. In some embodiments, set of memory cells such as a row of memory cells is a recently activated row if it is one of a plurality of recently accessed sets of memory cells (e.g., one of a plurality of recently accessed rows of memory cells). In another embodiment, a set of memory cells is a recently activated set of memory cells if the set of memory cells is included in the last three sets of memory cells that have been recently (most recently) accessed. In another embodiment, a set of memory cells is a recently activated set of memory cells if the set of memory cells is included in the last five sets of memory cells that have been recently (most recently) accessed. In some embodiments, the set of memory cells is a recently activated set of memory cells if it has been accessed responsive to one or more of the plurality of previous commands. For instance, in some embodiments, the set of memory cells is a recently accessed set if it has been accessed responsive to any one of the previous three commands (e.g., any one of the previous three activation commands) or any one of the previous five commands. While the three and five commands are described, other total number of commands can be employed. In yet another embodiment, a row of memory cells is a recently activated set of memory cells if the set of memory cells was recently activated within an active time threshold (e.g., accessed within a recent amount of elapsed time such as within the last 5 nanoseconds (ns), 10 ns, 20 ns, 30 ns, 50 ns, 100 ns, 200 ns, 400 ns, 1000 ns, 1500 ns, 2000 ns, etc.).

If the memory controller 315 determines that the set of memory cells (e.g., the first row of memory cells) is a recently activated set of memory cells, the memory controller 315 can pre-charge, for a second time period, the set of memory cells. For instance, the memory controller 315 can determine that a set of memory cells corresponding to at least a portion of the first page 327-1 is a recently activated set of memory cells, and responsive to the determination, impart a delay for a third time period after the pre-charging the set of memory cells corresponding to at least a portion of the first page 327-1. The memory controller 315 can apply the sensing voltage to the set of memory cells (e.g., the first row of memory cells) corresponding to at least the portion of the first page 327-1 after pre-charging the set of memory cells and imparting the delay to perform a memory access responsive to a second command of the plurality of command.

If the memory controller 315 determines that the set of memory cells (e.g., the first row of memory cells) is not a recently activated set of memory cells, the memory controller 315 can pre-charge, for a second time period, the set of memory cells corresponding to at least a portion of the first page 327-1 and refrain from imparting a delay. Responsive to pre-charging and refraining from imparting the delay, the memory controller 315 can apply the sensing voltage to the set of memory cells to perform a memory access responsive to a second command of the plurality of command.

In some embodiments, the memory controller 315 can impart a delay responsive to the fourth time period being less than a threshold active time. For example, if the fourth time period is less than a threshold active time the memory controller 315 can impart a delay to prevent systematic cell stress during open page hammering. In some embodiments, the fourth time period can be the time that elapse after the initial activation (e.g., first time period) but before the pre-charge (e.g., second time period).

In a non-limiting example, the memory controller 315 can cause the processing device to activate a first row of memory cells after receiving a first command associated with a first page 327-1 of memory cells. In some embodiments, the memory controller 315 can receive a second command associated with a second row of memory cells. The memory controller 315 can cause the processing device to activate a second row of memory cells to perform the second memory access responsive to a second command. The memory controller 315 can cause the processing device to refrain from imparting a delay between the first activation on the first row of memory cells and the second activation on the second row of memory cells due to the activations being on separate rows and the second row of memory cells not being a recently activated row.

Continuing with the previous example, the memory controller 315 can receive a third command associated with the first row of memory cells. The memory controller 315 can cause the processing device to impart a delay after a pre-charge of the row of memory cells before the activation of the first row of memory cells to perform the third memory access responsive to the third command. In some embodiments, the command can cause the processing device to impart a delay due to the first row of memory cells being a recently activated row. In some embodiments, the first row of memory cells may have been one of the last three rows activated. The memory controller 315 can impart a delay prior to the activation of the first row of memory cells to perform a third memory access to prevent a CCP or COP wear-out mechanism.

In another non-limiting example, the memory controller 315 can cause the processing device to activate a first row of memory cells after receiving a first command associated with a first page 327-1 of memory cells. In some embodiments, the memory controller 315 can receive a second command associated with a second row of memory cells. The memory controller 315 can cause the processing device to activate a second row of memory cells to perform the second memory access responsive to the second command. The memory controller 315 can receive a third command associated with a third row of memory cells. The memory controller 315 can cause the processing device to activate a third row of memory cells to perform the third memory access responsive to the third command. In addition, the memory controller can receive a fourth command associated with a fourth row of memory cells. The processing device can activate the fourth row of memory cells to perform the fourth memory access associated with the fourth command. The memory controller 315 may not cause the processing device to impart a delay between the activation on the different rows of memory cells due to the activations being on separate rows and the rows not being recently activated rows.

Continuing with the previous example, the memory controller 315 can receive a fifth command associated with the first row of memory cells. The memory controller 315 can refrain from imparting a delay after a pre-charge of the first row of memory cells and before the activation of the first row of memory cells to perform a fifth memory access responsive to the fifth command. In some embodiments, the memory controller 315 may not impart a delay due to the first row of memory cells not being a recently activated row (e.g., the first row can be one of the last three rows activated) as a COP or CCP wear-out mechanism is unlikely to occur.

Figure 4:
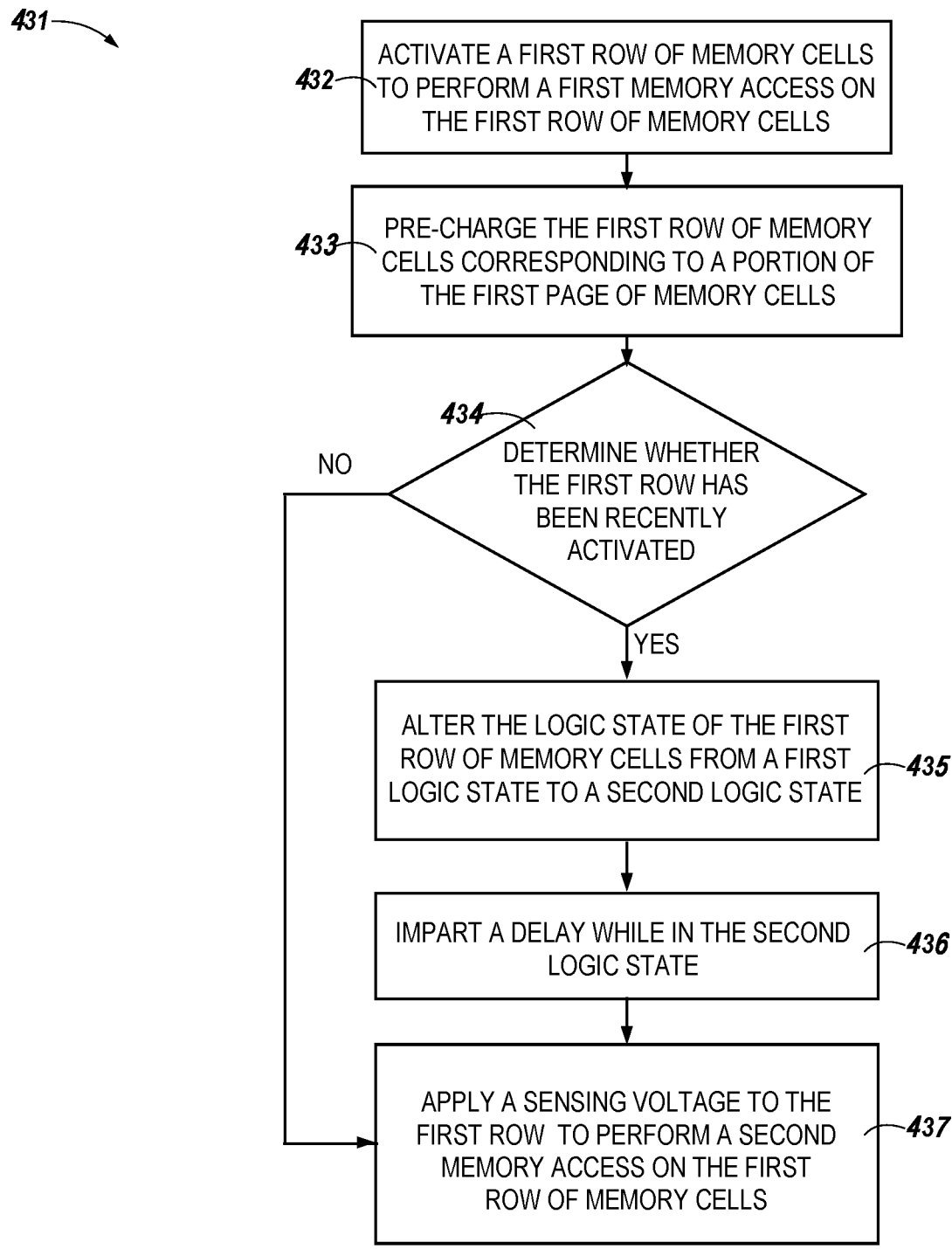
FIG. 4 illustrates a flow diagram corresponding to memory activation timing management in accordance with a number of embodiments of the present disclosure.

FIG. 4 illustrates a flow diagram 431 corresponding to a memory activation timing management in accordance with a number of embodiments of the present disclosure. In an embodiment described in connection with FIG. 4, a computer system (e.g., computer system 100) coupled to a host (e.g., the host 120) and including a memory controller (e.g., the controller 115), a processing device (e.g., processing device 117), and memory devices (e.g., first memory device 140 and second memory device 130).

At 432, the flow diagram 431 includes a processing device to activate a first row of the plurality of rows for a first time period, in a first logic state, to perform a first command of the plurality of command on the first row of memory cells in the memory device. A memory controller can receive a first command associated with a first row or memory cells. In some embodiments, the first command can relate to a read request to read data from one or more memory devices. In another embodiment, the first command can relate to a write request to write data to one or more memory devices. The memory controller can cause the processing device to activate a first row of memory cells to access one or more memory devices and perform the first command. The processing device can activate the first row of memory cells in a first logic state for a first time period to perform the first command.

At 433, the flow diagram 431, includes a processing device to pre-charge, for a second time period, a first row of memory cells corresponding to at least a portion of a first page of memory cells. In some embodiments, the memory controller can cause the processing device to pre-charge the first row of memory cells corresponding to a portion of the first page after the activation of the first row. The processing device can pre-charge the first row of memory cells to deactivate the first row after the previous activation.

In some embodiments, the memory controller can receive a second command associated with the first row of memory cells. The memory controller can cause the processing device to initiate a secondary activation of the first row of memory cells to perform a second memory access responsive to the second command. However, repeated activation of the same row of memory cells can cause a "continuous open page" or "continuous closed page" wear-out mechanism which could result in data corruption. The memory controller can cause the processing device to determine if the first row has been repeatedly activated before a subsequent activation of the first row of memory cells.

At 434, the flow diagram 431, includes a processing device to determine that the first row of memory cells is a recently activated row of memory cells. To prevent a "continuous open page" or "continuous closed page" wear-out mechanism on the memory system, the memory controller can cause the processing device to determine that the first row has been recently activated. If the first row of memory cells has not been recently activated row, the processing device can initiate a second activation responsive to the second command. The processing device can perform a second memory access by applying a sensing voltage to the first row of memory cells responsive to the second command. If the first row of memory cells is a recently activated row, the processing device can alter the logic state and delay a subsequent activation to prevent repeated activations of the same row before an active time threshold has been reached. Preventing repeated activations of the same row before an active time threshold has been reached can prevent a "continuous open page" or "continuous closed page" wear-out mechanism.

At 435, the flow diagram 431, includes a processing device to alter the logic state of the first row of memory cells from a first logic state to a second logic state prior to imparting the delay. In some embodiments, the processing device to alter the logic state of the first row of memory cells after a fourth time period and prior to imparting the delay. The fourth time period can be the time that elapse after the initial activation but before the pre-charge. If the memory controller determines that the first row is a recently activated row, the memory controller can respond yes and alter the logic state of the first row of memory cells. The memory controller can alter the logic state of the first row or memory cells to break the systematic and continuous wait of a page of memory cells associated with the first row of memory cells in the same logic state which could cause systematic cell stress and/or open page hammering (a "continuous open page" or "continuous closed page" wear-out mechanism).

At 436, the flow diagram 431, includes a processing device to impart a delay for a third time period responsive to the determination that the first row of memory cells is the recently activated row, as detailed herein. Imparting the delay can increase the time between activations on the same row and altering the logic state of the row can prevent/minimize the occurrence of a COP or CCP wear-out mechanism which can cause data corruption and/or cause the page to wear-out.

At 437, the flow diagram 431, includes a processing device to apply the sensing voltage to the first row of memory cells to perform a memory access responsive to a second command of the plurality of command. If the memory controller determines that the first row is not a recently activated row, the memory controller can respond no, refrain from imparting a delay, and apply the sensing voltage to the first row of memory cells. If the first row of memory cells is not a recently activated row the risk of a "continuous open page" or "continuous closed page" wear-out mechanism can be minimal or not present. As such, a delay may not be warranted to prevent a "continuous open page" or "continuous closed page" wear-out mechanism. In contrast, if the memory controller determines that the first row is a recently activated row, the memory controller can respond yes, impart the delay on the first row of memory cells, and apply the sensing voltage to the first row of memory cells to perform a memory access responsive to the second command after altering the logic state of the first row of memory cells. The processing device can initiate a subsequent (e.g., second) activation of the first row by applying a sensing voltage to the first row of memory cells. Imparting a delay in an altered logic state before a subsequent activation can break the systematic and continuous wait of a row in a first logic state preventing a "continuous open page" or "continuous closed page" wear-out mechanism which can cause charge leakage, parasitic currents, data corruption, and/or a page to wear-out, amongst other issues.

Figure 5:
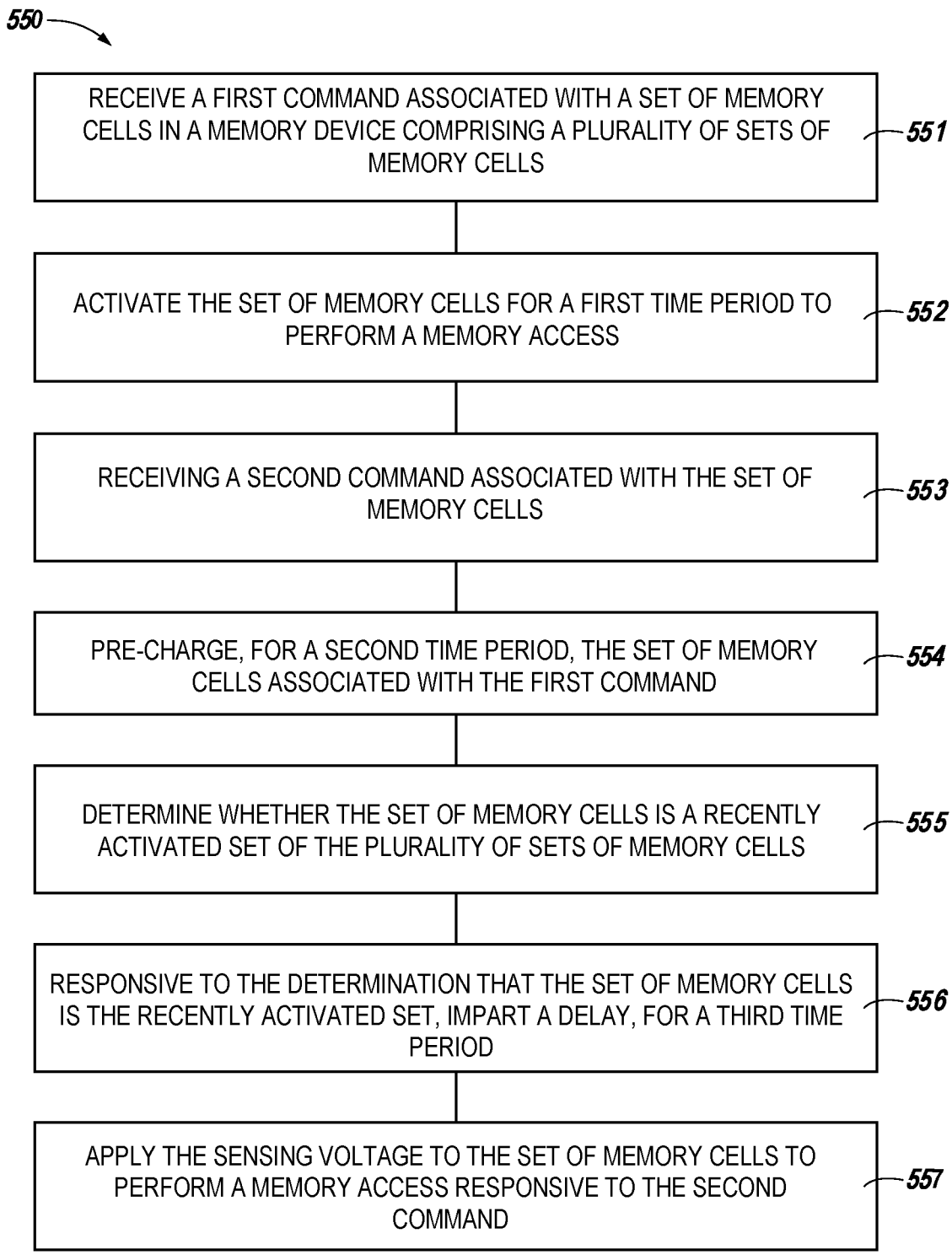
FIG. 5 illustrates a diagram representing an example method for memory activation timing management in accordance with a number of embodiments of the present disclosure.

FIG. 5 illustrates a diagram representing an example method 550 for memory activation timing management in accordance with a number of embodiments of the present disclosure. FIG. 5 describes an example of imparting a delay prior to a subsequent activation of a row of memory cells. As described herein in connection with FIG. 5, a computer system (e.g., computer system 100) can include a memory controller (e.g., the memory controller 115 of FIG. 1) and a processing device (e.g., the processing device 117 of FIG. 1). The memory controller can cause the processing device to impart a delay after a recently activated row of memory cells.

At 551, the method 550 describes the memory controller can receive a first command associated with a row of memory cells in a memory device comprising a plurality of rows of memory cells. The row of memory cells can correspond to a page of memory cells in the memory system. The memory controller can receive command to perform read requests and/or write requests of a row of memory cells. The memory controller can initiate an activation of a row of memory cells to perform the first memory access responsive to the first command. The memory controller can activate a row of memory cells to access one or more memory devices. For example, the memory controller can apply a sensing voltage to a row of memory cells to activate a row of memory cells.

At 552, the method 550 describes the memory controller can activate the row of memory cells for a first time period to perform a first memory access responsive to the first command on the row of memory cells. In some embodiments, the memory controller can activate the first row of memory cells in a first logic state. The memory controller can activate the first row of memory cells in the first logic state to perform a first memory access responsive to the first command. The memory controller can activate the first row of memory cells for a first time period to access one or more memory devices. In some embodiments, the first time period can range from 95 ns to about 500 ns.

At 553, the method 550 describes the memory controller can receiving a second command associated with the row of memory cells. The memory controller can receive a second command which can cause the memory controller to activate the first row of memory cells after the initial activation of the first row of memory cells. The subsequent activation of the first row of memory cells to perform the second memory access responsive to the second command can be a repeated activation of the first row of memory cells. Repeatedly activating the first row of the memory cells can cause data corruption in one or more memory devices.

At 554, the method 550 describes the memory controller can pre-charge, for a second time period, a row of memory cells corresponding to at least a portion of the row of memory cells. Prior to activating the first row of memory cells for a second time, the memory controller can pre-charge a row of memory cells associated with the first row of memory cells. In some embodiments, the memory controller can pre-charge the row of memory cells for a second time period to deactivate the first row of memory cells. In some embodiments, the second time period can be different than the first time period. The memory controller can pre-charge the row of memory cells of the first row of memory cells to deactivate the first row of memory cells before a subsequent reactivation of the first row of memory cells.

At 555, the method 550 describes the memory controller can determine whether the row is a recently activated row of the of memory cells. Prior to activating the first row of to perform a second memory access responsive to a second command, the memory controller can determine if the first row has been recently activated. In some embodiments, activating the first row of memory cells after a recent activation can cause a "continuous open page" or "continuous closed page" wear-out mechanism due to repeated activation of the first row of memory cells. Determining whether the first row has been recently activated can determine if the memory controller should take mitigating efforts to prevent the "continuous open page" or "continuous closed page" wear-out mechanism. In some embodiments, the memory controller can prevent a "continuous open page" or "continuous closed page" wear-out mechanism by imparting a delay.

At 556, the method 550 describes the memory controller may, responsive to the determination that the row of memory cells is the recently activated row, impart a delay, for a third time period. In some embodiment, the memory controller can impart a delay to increase the time between activations on the same row of memory cells. Increasing the time between activations on the same page can prevent a "continuous open page" or "continuous closed page" wear-out mechanism. Imparting a delay for a third time period can prevent data corruption. In some embodiments, the third time period can be different from the first and second time period. In another embodiment, the third time period can be equal to the first time period.

At 557, the method 550 describes the memory controller can apply the sensing voltage to the set of memory cells to perform a memory access responsive to the second command. After the memory controller imparts the delay, the memory controller can activate the first row of memory cells to perform the second memory access by applying a sensing voltage to a row of memory cells. Activating the first row of memory cells to perform a second memory access after imparting the delay can prevent issues caused by a "continuous open page" or "continuous closed page" wear-out mechanism.

Although specific embodiments have been illustrated and as described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving a first command associated with a row of memory cells within a memory array having a plurality of rows of memory cells in a memory device wherein the plurality of rows of memory cells correspond to respective portions of an array of memory cells of the memory device;

activating the row of memory cells for a first time period to perform a memory access responsive to the first command;

pre-charging the row of memory cells associated with the first command for a second time period, wherein the row of memory cells is pre-charged after a fourth time period which is equal to an elapsed time between the first time period and the second time period;

receiving a second command associated with the row of memory cells subsequent to the first command, wherein the row of memory cells associated with first command and the row of memory cells associated with the subsequent second command are determined to be the same row of memory cells thereby indicating page hammering;

determining that the row of memory cells associated with the first command and the subsequent second command is a recently activated row of the plurality of rows of memory cells that has been activated responsive to each of one or more of a plurality of previous commands including the first command, wherein a memory controller determines whether the row of memory cells associated with the first command or the subsequent second command is a recently activated set of memory cells by looking to at least one of an access history data store and a data table that tracks a history of recently activated sets of memory cells;

responsive to the determination that the row of memory cells associated with the first command and the subsequent second command is the recently activated row, imparting a delay for a third time period and altering a logic state of the row of memory cells from a first logic state to a second logic state that is different than the first logic state, wherein a determination is made whether a fourth time period is less than an active time threshold determined based on the data from the at least one of the access history data and the data table, wherein the delay for the third time period is to provide a time between the memory access of the row of memory cells responsive to the first command and a memory access of the row of memory cells responsive to the subsequent second command, wherein the third time period is greater than or equal to two times the first time period plus the second time period, wherein the first logic state is one of a logical value 1 or a logical value 0 and the second logic state is the other logical value; and after pre-charging the row of memory cells for the second time period and imparting the delay for the third time period, applying a sensing voltage to the row of memory cells associated with the subsequent second command to perform the memory access responsive to the subsequent second command.

2. The method of claim 1, wherein applying the sensing voltage further comprises applying the sensing voltage with the row of memory cells associated with the second command in the first logic state.

3. The method of claim 2, further comprising altering logic state of the row of memory cells associated with the second command from the first logic state to the second logic state prior to imparting the delay.

4. The method of claim 1, wherein the one or more of the plurality of previous commands further comprises one or more of a previous five commands.

5. The method of claim 1, wherein the one or more of the plurality of previous commands further comprises one or more of a previous three commands.

6. The method of claim 1, further comprising imparting the delay for a time period from about 400 nanoseconds (ns) to about 1000 ns.

7. The method of claim 6, further comprising imparting the delay to provide the time between the memory access responsive to the first command and the memory access responsive to the second command that is greater than about 1140 ns.

8. The method of claim 1, further comprising imparting the delay for the third time period to provide the time between the memory access responsive to the first command and the memory access responsive to the subsequent second command that is greater than or equal to two times the first time period plus the second time period to mitigate a continuous open page (COP) wear-out mechanism, a continuous closed page (CCP) wear-out mechanism, or both.

9. An apparatus, comprising:
a memory controller configured to, receive a plurality of commands associated with a plurality of rows of memory cells within a memory array having a plurality of rows of memory cells in a memory device corresponding to respective portions of an array of memory cells of the memory device; and
a processing device connected to the plurality of rows of memory cells to:
activate a row of the plurality of rows for a first time period, in a first logic state, to perform a memory access responsive to a first command;
responsive to the activation of the row, pre-charge, for a second time period, the row of memory cells corresponding to at least a portion of a page of memory cells associated with the first command, wherein the row of memory cells is pre-charged after a fourth time period which is equal to an elapsed time between the first time period and the second time period;
receive a subsequent second command associated with the row of memory cells, wherein the row of memory cells associated with first command and the row of memory cells associated with the subsequent second command are determined to be the same row of memory cells thereby indicating page hammering;
determine that the row of memory cells associated with the first command and the subsequent second command is a recently activated row of memory cells that has been activated responsive to one or more of a plurality of previous commands including the first command, wherein a memory controller determines whether the row of memory cells associated with the first command or the subsequent second command is a recently activated set of memory cells by looking to at least one of an access history data store and a data table that tracks a history of recently activated sets of memory cells;
impart a delay for a third time period prior to an application of a sensing voltage to the row of memory cells associated with the first command and alter a logic state of the row of memory cells from the first logic state to a second logic state that is different than the first logic state responsive to the determination that the row of memory cells associated with the first command is the recently activated row, wherein the delay for a third time period provides a time between the memory access of the row of memory cells responsive to the first command and a memory access of the row of memory cells responsive to the second command that is greater than or equal to two times the first time period plus the second time period, wherein a determination is made whether a fourth time period is less than an active time threshold determined based on the data from the at least one of the access history data and the data table, and wherein the first logic state is one of a logical value 1 or a logical value 0 and the second logic state is the other logical value; and apply the sensing voltage to the row of memory cells associated with the subsequent second command after the pre-charging and imparting the delay to perform the memory access responsive to the subsequent second command.

10. The apparatus of claim 9, wherein it is determined the row of memory cells associated with the first command is not the recently activated row of memory cells.

11. The apparatus of claim 10, wherein the processing device is to:
refrain from imparting the delay responsive to the determination that the row of memory cells associated with the first command is not recently activated row of memory cells; and
apply a sensing voltage to the row of memory cells associated with the subsequent second command to perform a memory access responsive to the subsequent second command after the pre-charging.

12. The apparatus of claim 9, further comprising a ferroelectric field-effect transistor (FeFET) memory device.

13. The apparatus of claim 9, further comprising a dynamic random-access memory (DRAM), ferroelectric random-access memory (FeRAM), or a resistive random-access memory (ReRAM) device, or any combination thereof.

14. The apparatus of claim 9, wherein the row of memory cells associated with the first command is altered from the first logic state to a second logic state prior to imparting the delay.

15. The apparatus of claim 9, further comprising a second memory device comprising a plurality of rows of memory cells.

16. A system, comprising:
a memory system including a memory device comprising a plurality of rows of memory cells forming at least a portion of a plurality of pages corresponding to respective portions of an array of memory cells of the memory device; and
a memory controller to:
activate for a first time period, in a first logic state, a row of memory cells corresponding to at least a portion of a first page to perform a memory access responsive to a first command;
pre-charge, for a second time period, the row of memory cells corresponding to at least the portion of the first command, wherein the row of memory cells is pre-charged after a fourth time period;
receive a subsequent second command associated with the row of memory cells, wherein the row of memory cells associated with first command and the row of memory cells associated with the subsequent second command are determined to be the same row of memory cells thereby indicating page hammering;
determine that the row of memory cells associated with the first command and the subsequent second command is a recently activated row;
alter a logic state of the row of memory cells from the first logic state to a second logic state that is different than the first logic state, wherein the first logic state is one of a logical value 1 or a logical value 0 and the second logic state is the other logical value;
impart a delay, in the second logic state, for a third time period responsive to the determination that the row of memory cells associated with the first command and the subsequent second command is a recently activated row, wherein a memory controller determines whether the row of memory cells associated with the first command or the subsequent second command is a recently activated set of memory cells by looking to at least one of an access history data store and a data table that tracks a history of recently activated sets of memory cells, and wherein the recently activated row has been activated responsive to one or more of a plurality of previous activation commands including the first command, and wherein a determination is made whether a fourth time period is less than an active time threshold determined based on the data from the at least one of the access history data and the data table; and
apply a sensing voltage to the row of memory cells associated with the subsequent second command after pre-charging and imparting the delay to perform the memory access responsive to the subsequent second command after a fifth time period, and wherein the delay for the third time period provides a sixth time period between the memory access of the row of memory cells responsive to the first command and the memory access of the row of memory cells responsive to the subsequent second command that is greater than or equal to two times the first time period plus the second time period.

17. The system of claim 16, further comprising a second memory device comprising a plurality of rows of memory cells.

18. The system of claim 16, further comprising not imparting the delay responsive to the fourth time period.

19. The system of claim 16, further comprising a plurality of input/output (I/O) lanes configured to transfer a plurality of commands to or from circuitry external to the memory controller at a rate of around thirty-two (32) giga-transfers per second.

20. The system of claim 17, further comprising a peripheral component interconnect express (PCIe) 5.0 interface coupled to a plurality of I/O lanes, wherein the memory controller is to receive commands involving at least one of the memory device, the second memory device, or any combination thereof, via the PCIe 5.0 interface according to a compute express link memory system.

* * * * *